(12) United States Patent
Chang

(10) Patent No.: US 9,614,175 B2
(45) Date of Patent: *Apr. 4, 2017

(54) ORGANIC LIGHT-EMITTING DIODE DEVICE

(71) Applicant: AROLLTECH CO., LTD., New Taipei (TW)

(72) Inventor: Yih Chang, New Taipei (TW)

(73) Assignee: AROLLTECH CO., LTD., New Taipei (TW)

( * ) Notice: Subject to any disclaimer, the term of this patent is extended or adjusted under 35 U.S.C. 154(b) by 259 days.

This patent is subject to a terminal disclaimer.

(21) Appl. No.: 14/242,159

(22) Filed: Apr. 1, 2014

(65) Prior Publication Data

US 2014/0209887 A1 Jul. 31, 2014

Related U.S. Application Data

(63) Continuation-in-part of application No. 13/293,644, filed on Nov. 10, 2011, now Pat. No. 8,742,659.

(30) Foreign Application Priority Data

Nov. 11, 2010 (TW) .............................. 99138776 A

(51) Int. Cl.
 *H01J 1/62* (2006.01)
 *H01L 51/52* (2006.01)
 *H01L 27/32* (2006.01)

(52) U.S. Cl.
 CPC ...... *H01L 51/5209* (2013.01); *H01L 27/3288* (2013.01); *H01L 27/3211* (2013.01)

(58) Field of Classification Search
 CPC .................. H01L 51/5012; H01L 27/3244
 USPC ......................................... 313/504, 506, 498
 See application file for complete search history.

(56) References Cited

U.S. PATENT DOCUMENTS

2003/0001488 A1  1/2003  Sundahl
2006/0108913 A1  5/2006  Cok

*Primary Examiner* — Vip Patel
(74) *Attorney, Agent, or Firm* — Ladas & Parry LLP

(57) ABSTRACT

An OLED device includes: a transparent substrate; a light-emitting stack including an anode layer, a cathode layer, and a functional layer, the anode layer including anode units, each of which has first and second anode elements that extend in a column direction and that are aligned with and spaced apart from each other along a row direction transverse to the column direction; an anode-connecting metallic layer stacked on the light-emitting stack; a cathode-connecting metallic layer stacked on the light-emitting stack; and bridging lines disposed in the light-emitting stack and extending in the row direction such that the first and second anode elements are electrically connected to each other through a respective one of the bridging lines.

13 Claims, 18 Drawing Sheets

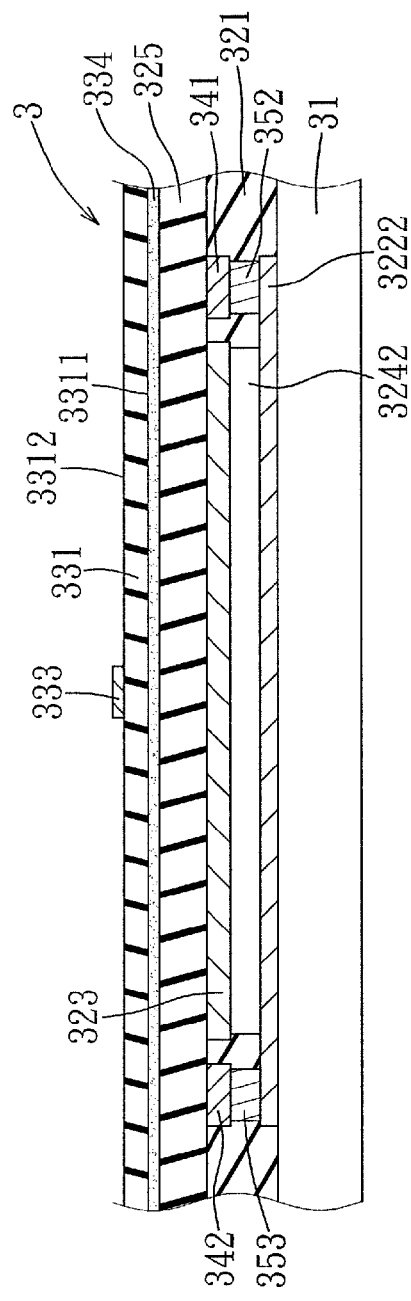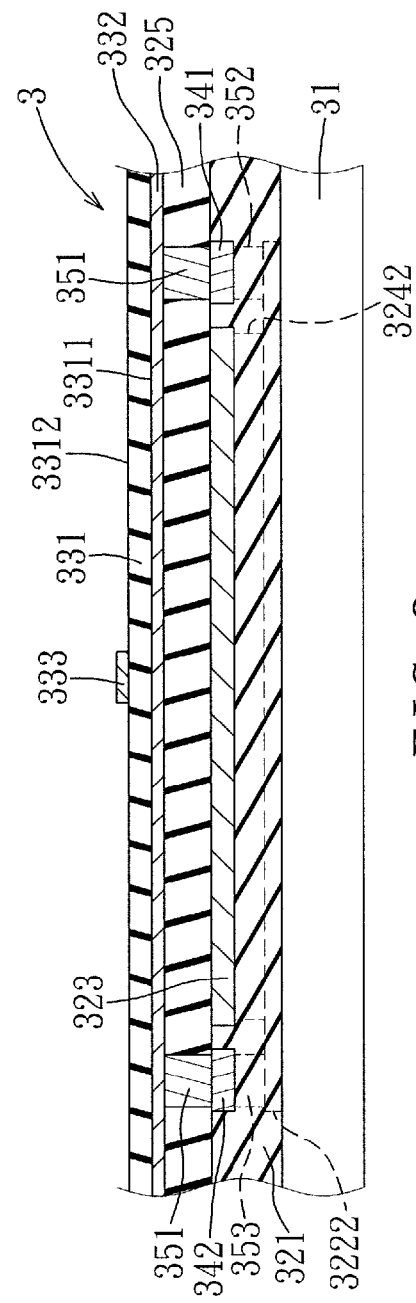

ORGANIC LIGHT-EMITTING DIODE DEVICE

CROSS-REFERENCE TO RELATED APPLICATION

This application is a continuation-in-part (CIP) of U.S. patent application Ser. No. 13/293,644, filed on Nov. 10, 2011, the entire disclosure of which is incorporated herein by reference.

BACKGROUND OF THE INVENTION

1. Field of the Invention

This invention relates to an organic light-emitting diode (OLED) device, more particularly to an OLED device having pairs of separate anode elements connected through respective conductive bridging lines.

2. Description of the Related Art

FIGS. 1 and 2 illustrate a display tile 2 of a conventional tiled display device disclosed in U.S. Pat. No. 6,897,855. The display tile 2 includes front and back layered structures 21, 22 disposed one above the other. The back layered structure 21 includes a circuit board 211 and a plurality of optional layers 212. The circuit board 211 has a bottom surface provided with a power connector 2112, electronic circuitry 2113 connected to the power connector 2112, and a plurality of first and second conductors 2114, 2115 connected to the electronic circuitry 2113. The front layered structure 22 includes a transparent glass substrate 221, a filter 222 formed on the glass substrate 221, parallel column electrodes 223 formed on the filter 222, a displaying material layer 224 formed on the column electrodes 223, and parallel row electrodes 225 formed on the displaying material layer 224. A plurality of first vias 23 are connected to the first conductors 2114 and extend through a first edge of the circuit board 211 and first edges of the optional layers 212 into the front layered structure 22 to connect with the column electrodes 223, respectively. A plurality of second vias 24 are connected to the second conductors 2115 and extend through a second edge of the circuit board 211 and second edges of the optional layers 212 into the front layered structure 22 to connect with the row electrodes 225, respectively. The column electrodes 223 are made from a transparent material of indium tin oxide (ITO) so as to permit light emitted or reflected by the displaying material layer 224 to pass through the column electrodes 223 and the glass substrate 221.

The aforesaid display tile 2 is disadvantageous in that the arrangement of the column electrodes 223 and the first and second vias 23, 24 is only suitable for a small size and rigid substrate (the glass substrate 221), and is likely to incur displaying problems, such as non-uniform light emission, poor displaying quality and dead spots (incapable of displaying), when using a large size and flexible substrate instead of the glass substrate 221. In addition, the column electrodes 223 made of ITO are fragile, and tend to break, which may cause a portion of the display tile 2 to lose its function.

SUMMARY OF THE INVENTION

Therefore, an object of the present invention is to provide an OLED device that can overcome the aforesaid drawbacks associated with the prior art.

According to this invention, there is provided an OLED device that comprises: a transparent substrate; a light-emitting stack stacked on the transparent substrate and including a patterned transparent anode layer, a cathode layer, and a functional layer disposed between the anode layer and the cathode layer, the anode layer including an anode array of spaced apart anode units arranged in columns and rows, each of the anode units having first and second anode elements that extend in a column direction and that are aligned with and spaced apart from each other along a row direction transverse to the column direction, wherein the anode layer, the functional layer, and the cathode layer are stacked one above another along a vertical direction transverse to the row direction and the column direction; an anode-connecting metallic layer stacked on the light-emitting stack along the vertical direction; a cathode-connecting metallic layer stacked on the light-emitting stack along the vertical direction and connected electrically to the cathode layer; and a plurality of conductive bridging lines disposed in the light-emitting stack and connected electrically to the anode-connecting metallic layer. Each of the bridging lines extends in the row direction such that the first and second anode elements of each of the anode units are electrically connected to each other through a respective one of the bridging lines.

BRIEF DESCRIPTION OF THE DRAWING

Other features and advantages of the present invention will become apparent in the following detailed description of the preferred embodiments of this invention, with reference to the accompanying drawings, in which:

FIG. 7 is a fragmentary sectional view of the first preferred embodiment taken along line VII-VII of FIG. 3;

FIG. 8 is a fragmentary sectional view of the first preferred embodiment taken along line VIII-VIII of FIG. 3;

DETAILED DESCRIPTION OF THE PREFERRED EMBODIMENTS

Figure 1:
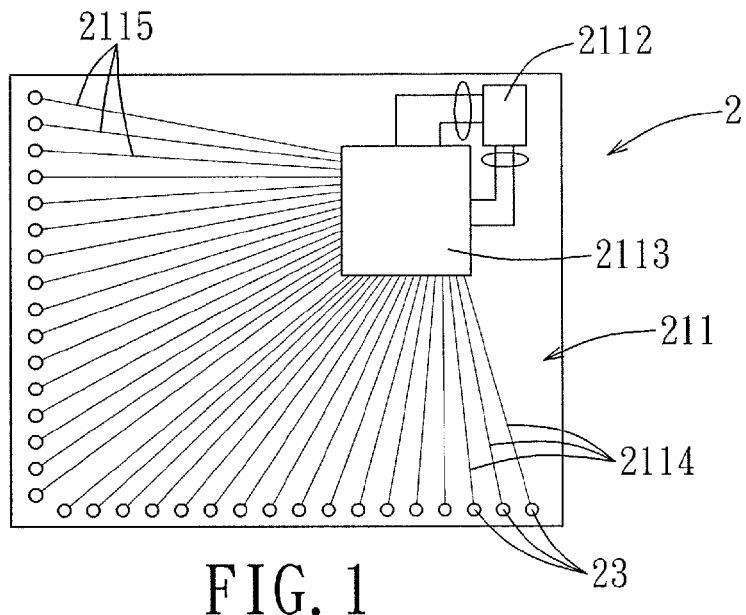
FIG. 1 is a perspective view of a conventional display tile.
Figure 2:
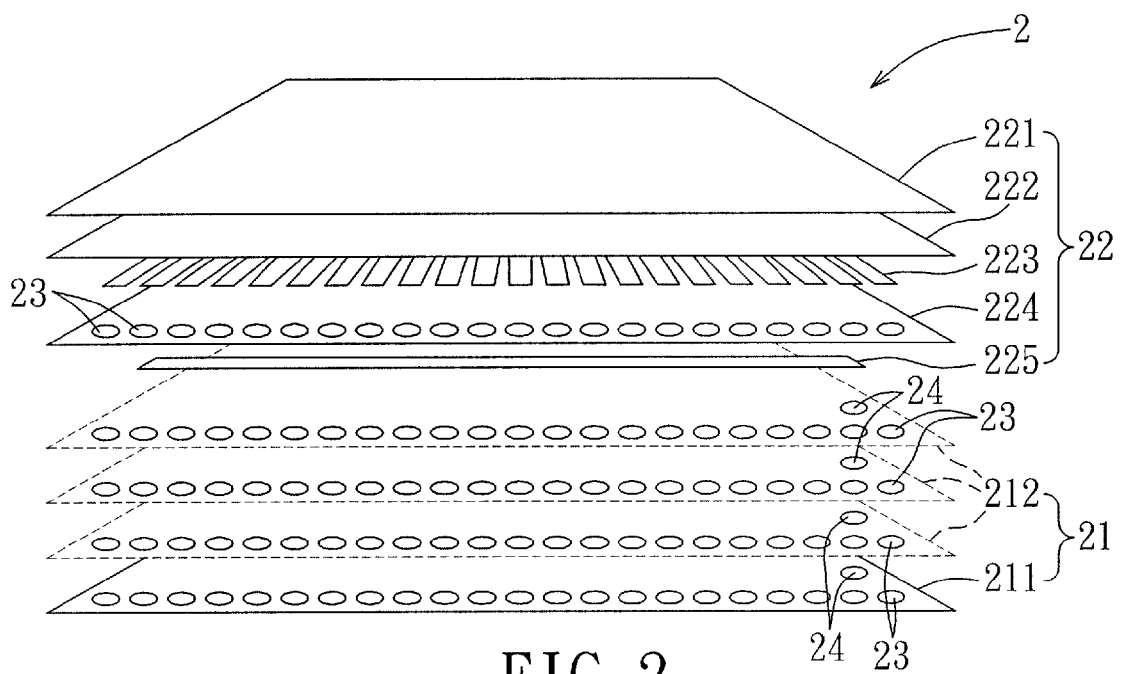
FIG. 2 is an exploded perspective view of the conventional display tile.
Figure 3:
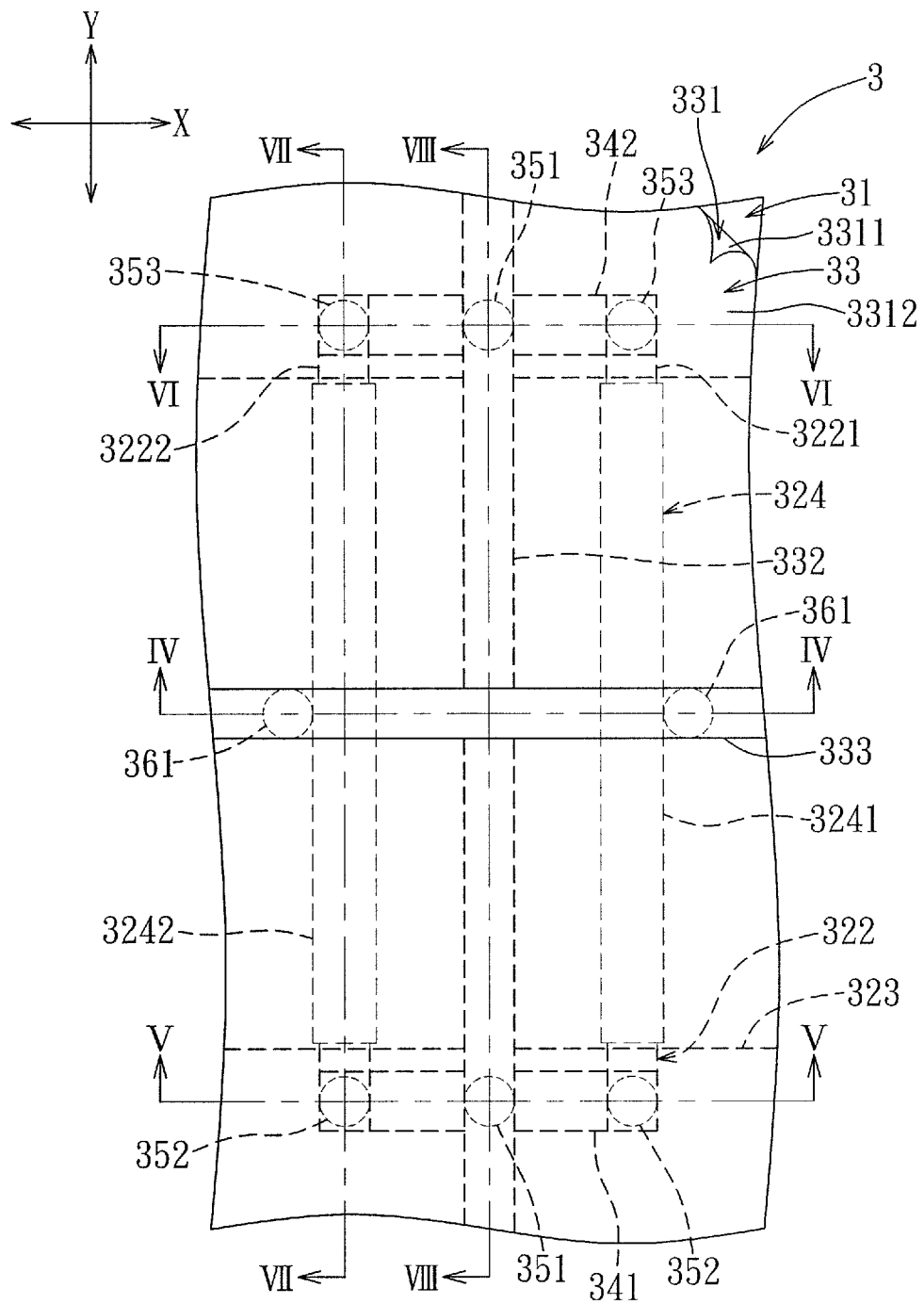
FIG. 3 is a fragmentary schematic view of the first preferred embodiment of an electroluminescent assembly of an OLED device according to the present invention.
Figure 4:
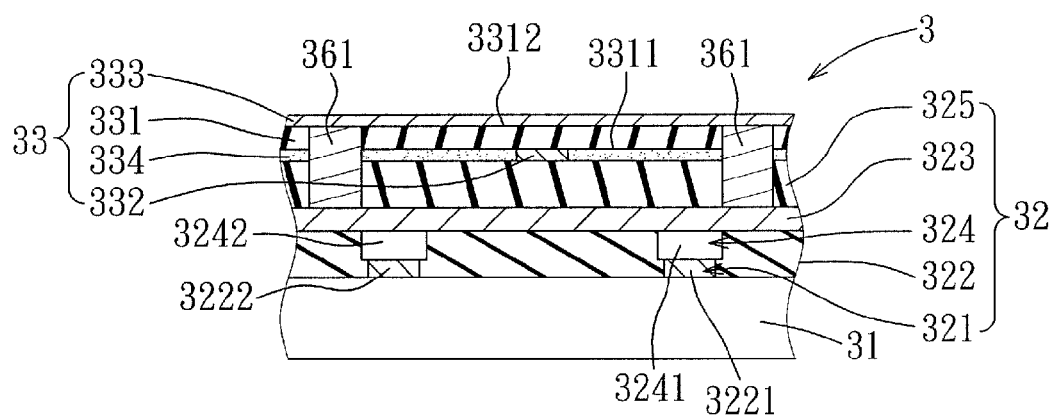
FIG. 4 is a fragmentary sectional view of the first preferred embodiment taken along line IV-IV of FIG. 3.
Figure 5:
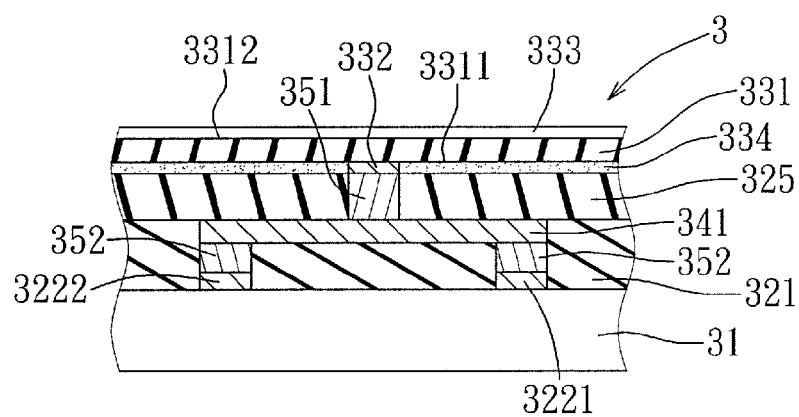
FIG. 5 is a fragmentary sectional view of the first preferred embodiment taken along line V-V of FIG. 3.
Figure 6:
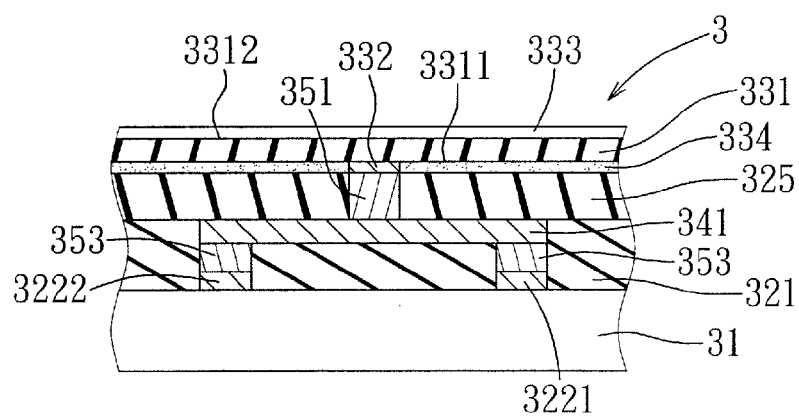
FIG. 6 is a fragmentary sectional view of the first preferred embodiment taken along line VI-VI of FIG. 3.

Before the present invention is described in greater detail with reference to the accompanying preferred embodiments, it should be noted herein that like elements are denoted by the same reference numerals throughout the disclosure.

Figure 9:
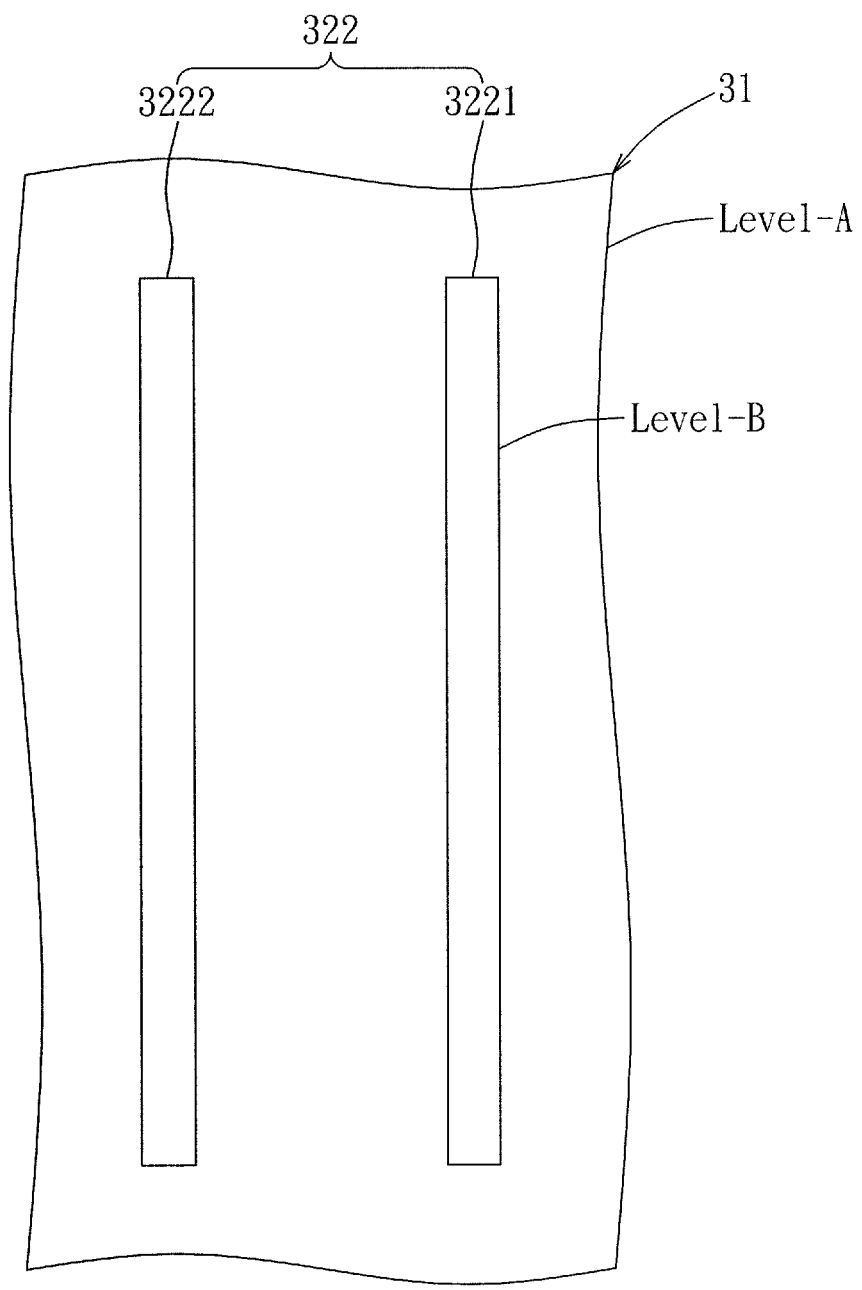
FIG. 9 is a fragmentary schematic view illustrating a ground level and a first level the first preferred embodiment.
Figure 10:
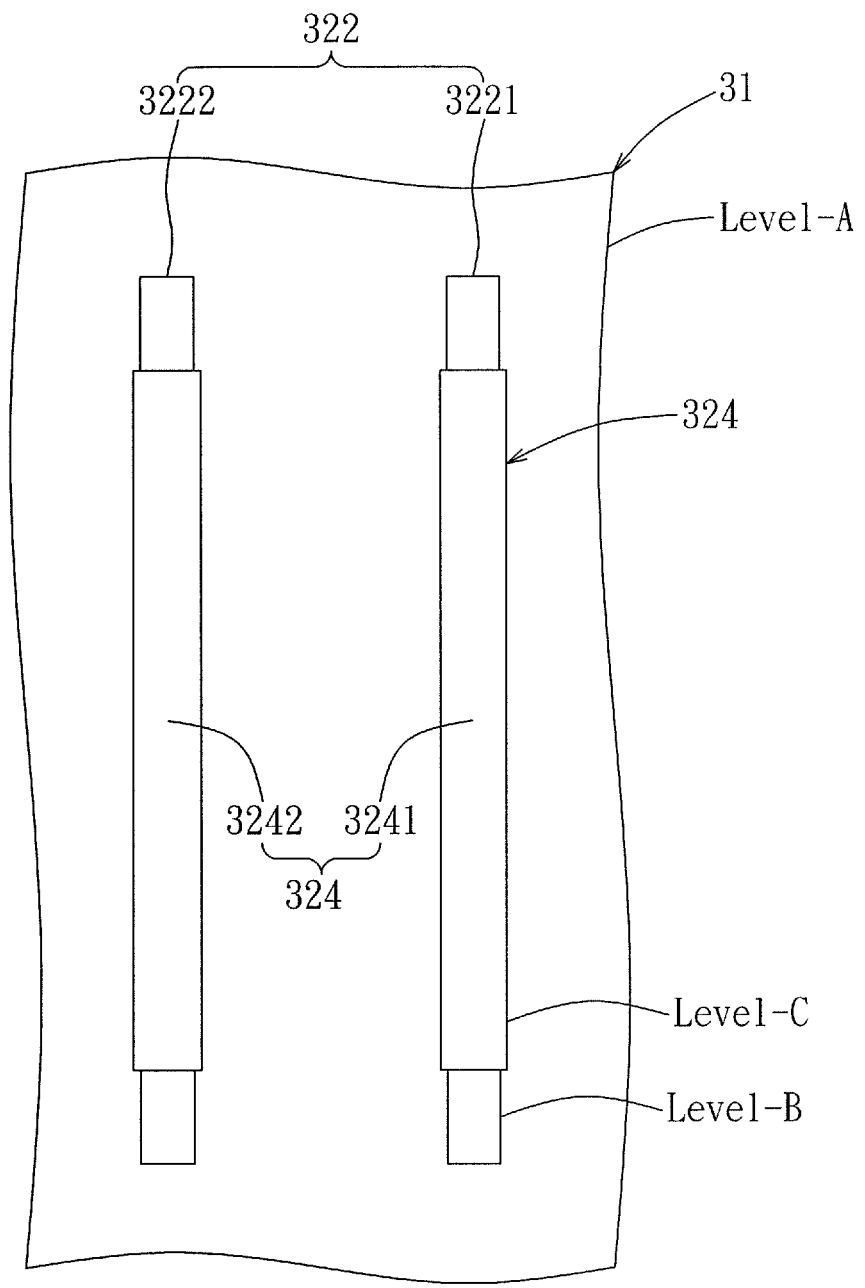
FIG. 10 is a fragmentary schematic view illustrating a second level of the first preferred embodiment.
Figure 11:
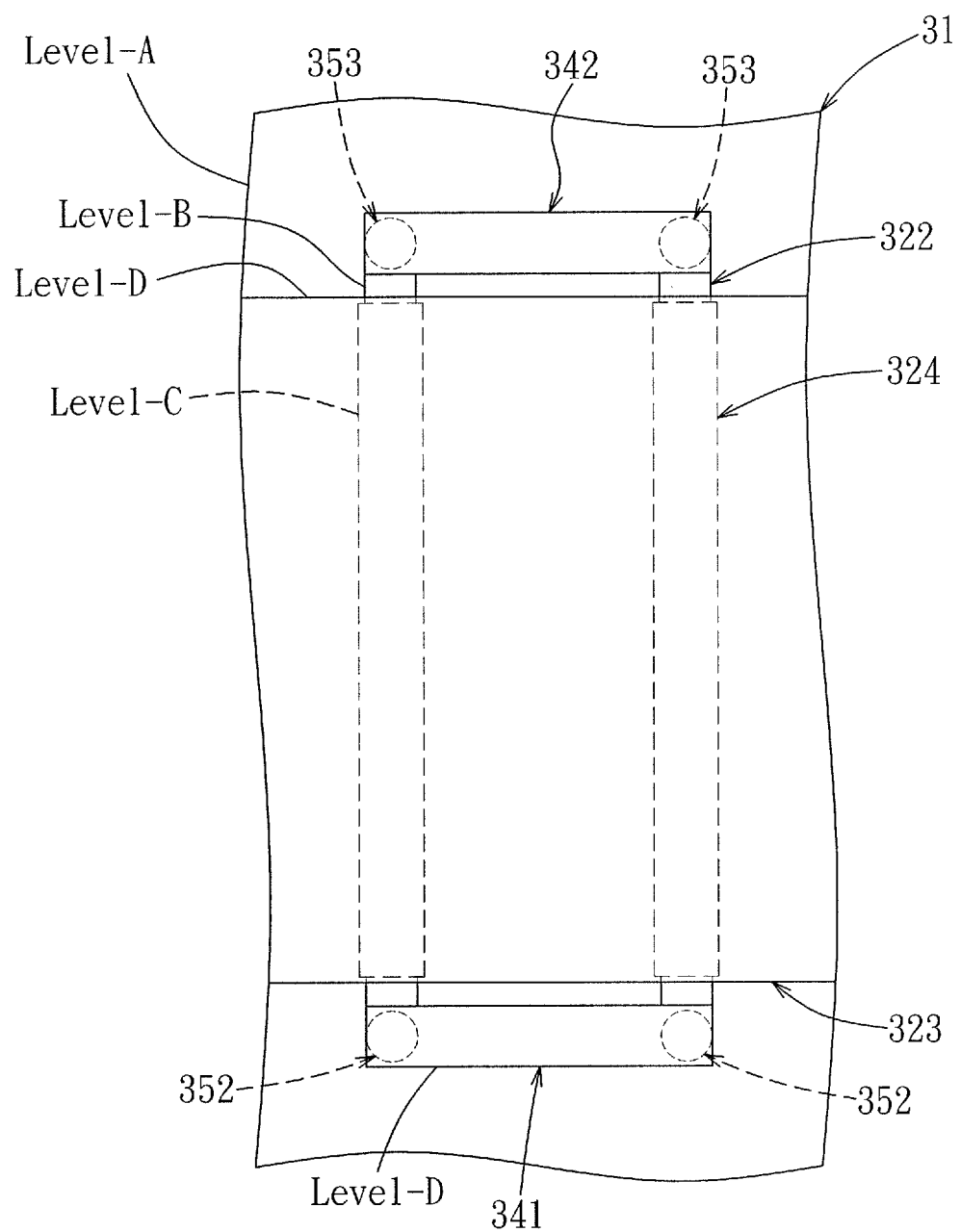
FIG. 11 is a fragmentary schematic view illustrating a third level of the first preferred embodiment.

FIGS. 3 to 8, in combination with FIGS. 9 to 11, illustrate the first preferred embodiment of an electroluminescent assembly 3 of an OLED device according to this invention. The OLED device may be used as a display or a light emitting source.

The electroluminescent assembly 3 includes: a transparent substrate 31 (disposed at a ground level indicated as layer level-A in FIG. 9); a first stack 32 including an inter insulative layer 321 formed on the substrate 31, a transparent anode layer 322 (disposed at a first layer level indicated as layer level-B in FIG. 9) formed on the substrate 31 and surrounded by the inter insulative layer 321, a cathode layer 323 surrounded by the inter insulative layer 321, at least one functional layer 324 (disposed at a second layer level indicated as layer level-C in FIG. 10) disposed between the anode layer 322 and the cathode layer 323 (disposed at a third layer level indicated as layer level-D in FIG. 11), and an overcoat 325 formed on the inter insulative layer 321 and the cathode layer 323, the anode layer 322 having juxtaposed first and second anode elements 3221, 3222, the functional layer 324 having first and second functional elements 3241, 3242 disposed on the first and second anode elements 3221, 3222, respectively, the first and second anode elements 3221, 3222 being aligned along a row direction (X), the cathode layer 323 extending across the first and second functional elements 3241, 3242 in the row direction (X); a second stack 33 disposed on the first stack 32 and including a first insulating layer 331 having opposite first and second surfaces 3311, 3312, a conductive column line 332 disposed on the first surface 3311 of the first insulating layer 331 and extending in a column direction (Y) transverse to the row direction (X), a conductive row line 333 disposed on the second surface 3312 of the first insulating layer 331 and extending in the row direction (X), and a second insulating layer 334 disposed between and bonded to the first surface 3311 of the first insulating layer 331 and the overcoat 325; a conductive first bridging line 341 disposed in the first stack 32 and connected to the first and second anode elements 3221, 3222; a conductive second bridging line 342 disposed in the first stack 32, connected to the first and second anode elements 3221, 3222, and opposite to the first bridging line 341 in the column direction (Y); an upper via unit including two upper contact vias 351 extending from the conductive column line 332 through the overcoat 325 into the first stack 32 and connected to the first and second bridging lines 341, 342, respectively; and a cathode via unit including two cathode contact vias 361 extending vertically from the conductive row line 333 through the first and second insulative layers 331, 334 and the overcoat 325 into the first stack 32 and to two opposite ends of the cathode layer 323, respectively.

The first and second functional elements 3241, 3242 are defined herein refer to a structure that can be activated by applying a voltage across the anode layer 322 and the cathode layer 323 to perform functions, such as light emission, light transmission, light modulation, signal processing, signal switching, signal amplification, and signal detection. In this embodiment, the first and second functional elements 3241, 3242 contain an organic electroluminescent medium that can emit light in response to an electric current passing therethrough. The organic electroluminescent medium is normally comprised of an organic hole-transporting film, an organic electron-transporting film, and an organic light emitting film disposed between the organic hole-transporting film and the organic electron-transporting film.

In this embodiment, the first and second bridging lines 341, 342 are the same layer as the cathode layer 323 (i.e., disposed at the third layer level-D). Alternatively, the first and second bridging lines 341, 342 may be the same layer as the anode layer 322 (not shown).

In this embodiment, the upper contact vias 351 extend vertically from the conductive column line 332 to the first and second bridging lines 341, 342, respectively. The OLED device further includes a lower via unit having two first lower contact vias 352 extending vertically and respectively from the first and second anode elements 3221, 3222 through the inter insulative layer 321 to the first bridging line 341, and two second lower contact vias 353 extending vertically and respectively from the first and second anode elements 3221, 3222 through the inter insulative layer 321 to the second bridging line 342. Alternatively, when the first and second bridging lines 341, 342 are disposed at the same layer as the anode layer 322, the upper contact vias 351 may extend directly from the conductive column line 332 to one of the first and second anode elements 3221, 3222 or to the first and second bridging lines 341, 342, respectively (not shown).

The transparent substrate 31 and the first and second stacks 32, 33 are preferably flexible so that the entire OLED device can be made flexible.

The inter insulative layer 321 can be one single layer or multiple layers depending upon the patterning processes of making the lower contact vias 352 and 353 and the first and second conductive bridging lines 341 and 342, adopted in this invention.

The anode layer 322 is made from a conductive transparent material, such as indium tin oxide (ITO). The cathode layer 323 and the first and second bridging lines 341, 342 are preferably made from metal, such as aluminum, copper, silver, gold, and alloys thereof.

The overcoat 325 can be one single layer or multiple layers depending upon the bonding processes of laminating the first stack 32 and the second stack 33.

Figure 12:
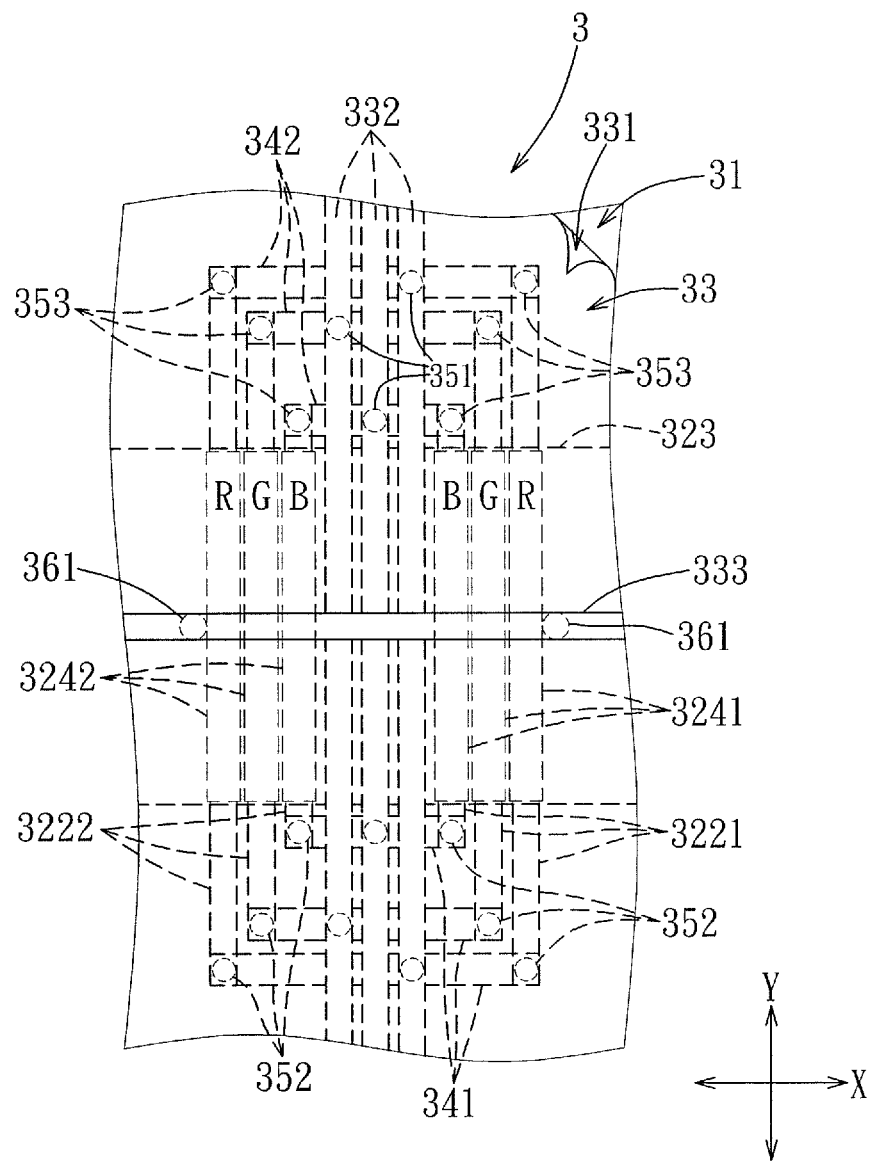
FIG. 12 is a fragmentary schematic view of the second preferred embodiment of the electroluminescent assembly of the OLED device according to the present invention.
Figure 13:
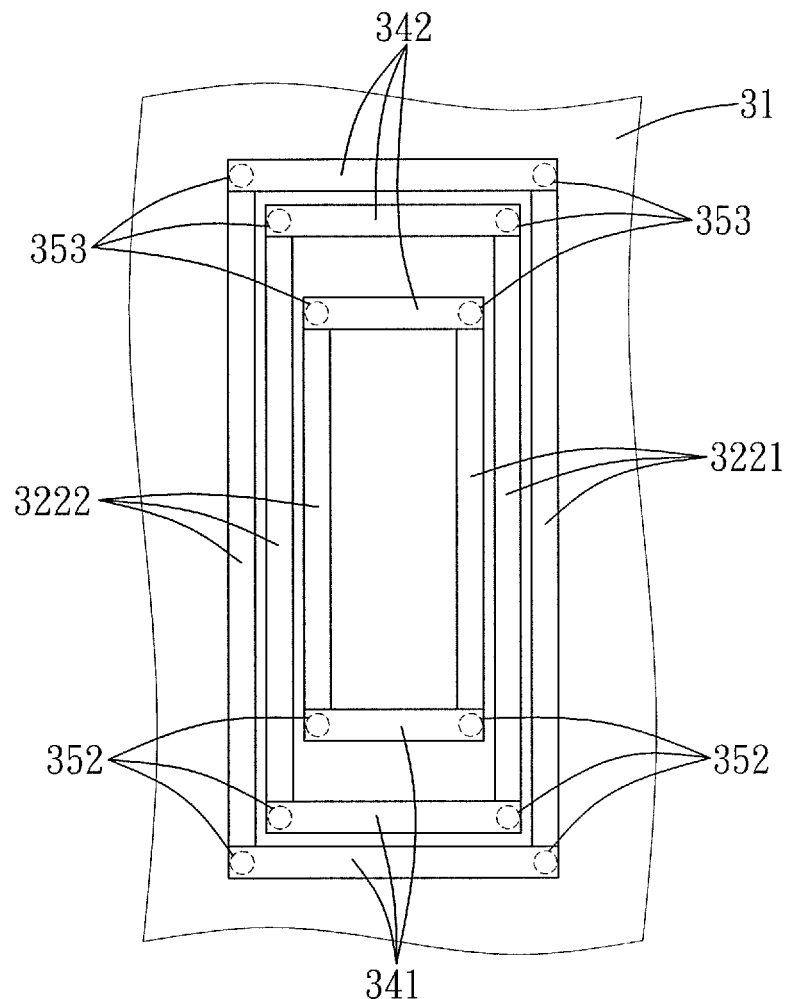
FIG. 13 is a fragmentary schematic view of an assembly of a substrate, an anode layer, first and second bridging lines and first and second lower contact vias of the second preferred embodiment.

FIGS. 12 and 13 illustrate the second preferred embodiment of the electroluminescent assembly 3 of the OLED device according to this invention. The second preferred embodiment differs from the previous embodiment in that the electroluminescent assembly 3 of the second preferred embodiment includes three first anode elements 3221, three second anode elements 3222, three first functional elements 3241 formed respectively on the first anode elements 3221, three second functional elements 3242 formed respectively on the second anode elements 3222, three column lines 332, three first bridging lines 341, three second bridging lines 342, three upper via units (each including two upper contact vias 351) and three lower via units (each including two first lower contact vias 352 and two second lower contact vias 353). The first and second anode elements 3221, 3222 are aligned along the row direction (X). The first and second bridging lines 341, 342 are aligned along the column direction (Y).

Each of the upper via units and a respective one of the lower via units cooperatively connect a respective one of the conductive column lines 332 to a respective one of the first anode elements 3221 and a respective one of the second anode elements 3222 through a respective one of the first bridging lines 341 and a respective one of the second bridging lines 342. The connection between each upper via unit and the corresponding first and second anode elements 3221, 3222 is substantially the same as that of the upper via unit of the first preferred embodiment (see FIGS. 3 to 8).

The first and second functional elements 3241, 3242 are capable of displaying different colors. In this embodiment, the first functional elements 3241 can display red, green and blue colors in a right-to-left direction, and the second functional elements 3242 can display blue, green and red colors in the right-to-left direction. Accordingly, each of the first functional elements 3241 and the corresponding one of the second functional elements 3242, which are respectively formed on the first and second anode elements 3221, 3222 that are connected through the respective one of the first bridging lines 341 and the respective one of the second bridging lines 342 and which are symmetrically disposed, display the same color.

Figure 14:
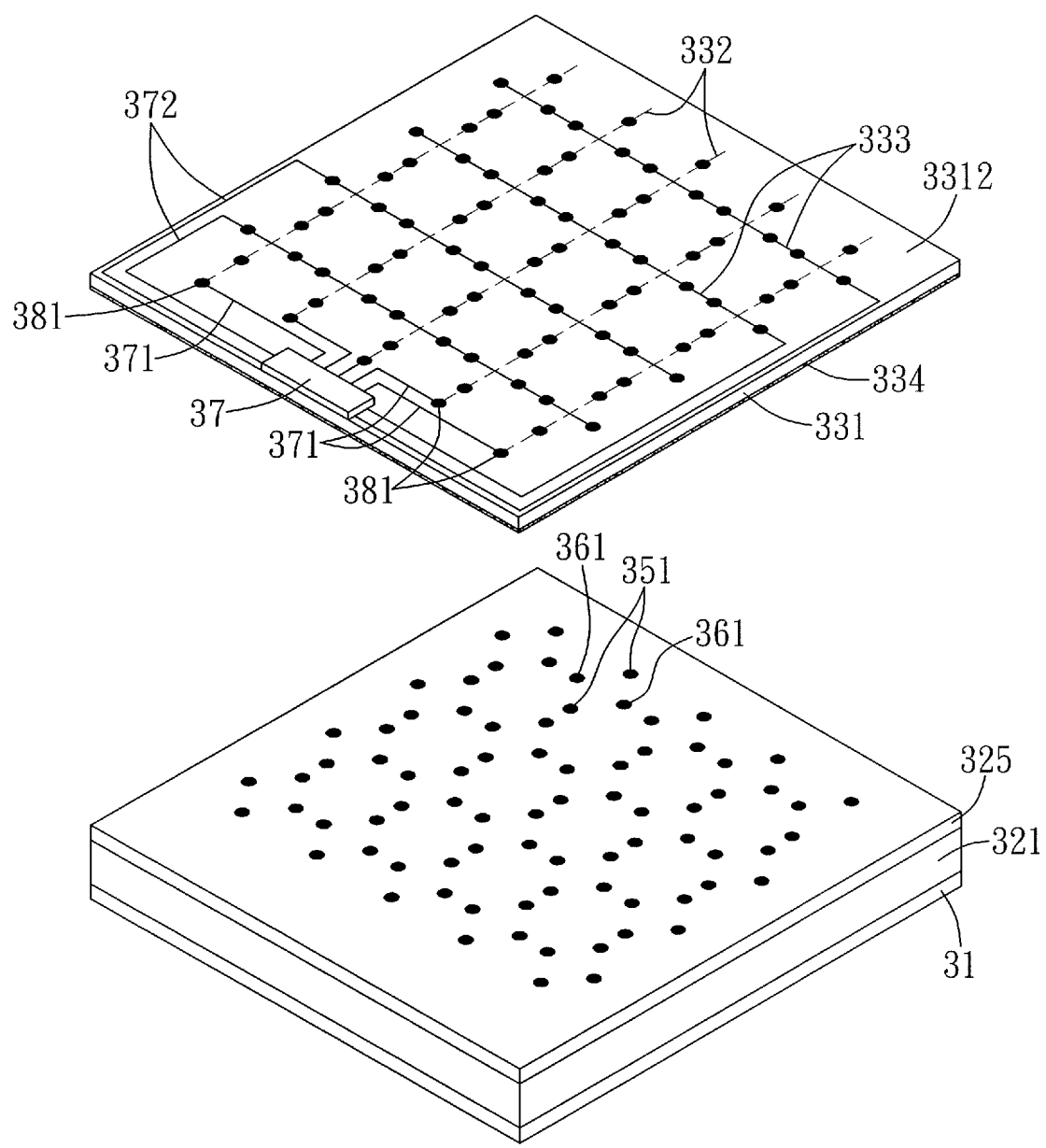
FIG. 14 is an exploded perspective view of the first preferred embodiment of an OLED device according to the present invention.
Figure 15:
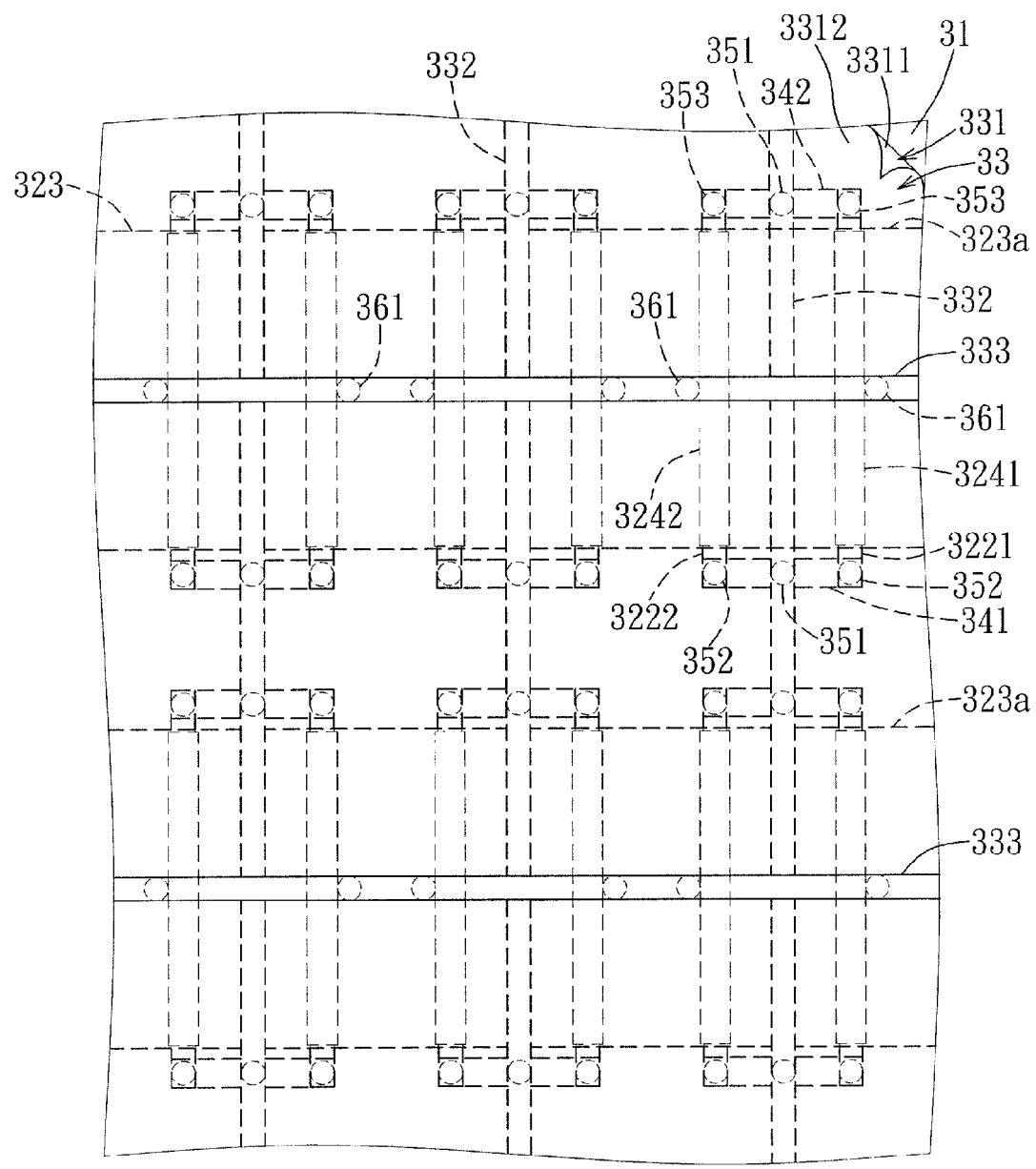
FIG. 15 is a fragmentary schematic plan view of the first preferred embodiment of the OLED device.
Figure 16:
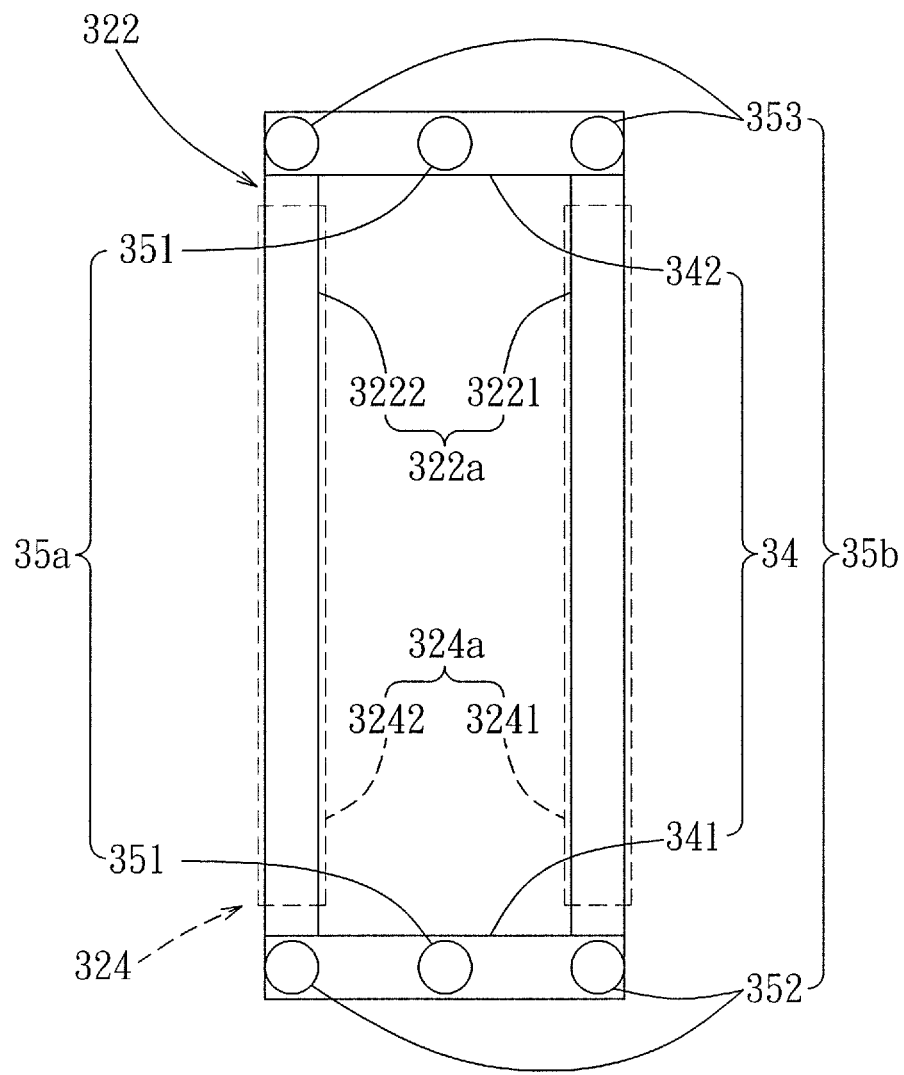
FIG. 16 is a schematic view illustrating an assembly of an anode unit, a functional unit, a bridging unit and a lower via unit of the first preferred embodiment of the OLED device.

FIGS. 14 to 16, in combination with FIGS. 3 to 8, illustrate the first preferred embodiment of an OLED device according to this invention. The OLED device can be viewed as a combination of a plurality of the electroluminescent assemblies 3 of the preferred embodiment shown in FIG. 3, that are arranged in columns and rows. Hence, the first preferred embodiment of the OLED device includes: a transparent substrate 31; a first stack 32 including a patterned inter insulative layer 321 formed on the substrate 31, a patterned transparent anode layer 322 formed on the substrate 31, a patterned cathode layer 323, a patterned functional layer 324 disposed between the anode layer 322 and the cathode layer 323, and an overcoat 325 formed on the inter insulative layer 321 and the cathode layer 323, the anode layer 322 including an anode array of a plurality of anode units 322a arranged in columns, the cathode layer 323 including a plurality of cathode units 323a, each of which is in the form of a metal band crossing the anode units 322a of a respective one of the rows of the anode array, the functional layer 324 including a functional array of a plurality of functional units 324a arranged in columns and formed respectively on the anode units 322a of the anode array; a second stack 33 disposed on the first stack 32 and including a first insulating layer 331 having opposite first and second surfaces 3311, 3312, a plurality of conductive column lines 332 disposed on the first surface 3311 of the insulating layer 331 and extending in a column direction (Y), a plurality of conductive row lines 333 disposed on the second surface 3312 of the insulating layer 331, and a second insulating layer 334 disposed between and bonded to the first insulating layer 331 and the overcoat 325, the conductive row lines 333 extending in a row direction (X) transverse to the column direction (Y); an upper via array of upper via units 35a arranged in columns, the upper via units 35a of each of the columns of the upper via array extending from a respective one of the conductive column lines 332 into the first stack 32 and being connected to the anode units 322a of a respective one of the columns of the anode array, respectively; and a cathode via array of cathode contact vias 361 arranged in rows. The cathode contact vias 361 of each of the rows of the cathode via array extend from a respective one of the conductive row lines 333 into the first stack 32 and are connected to a corresponding one of the cathode units 323a.

In this embodiment, each of the anode units 322a of each of the columns of the anode array includes oppositely disposed first and second anode elements 3221, 3222. Each of the functional units 324a of each of the columns of the display array includes oppositely disposed first and second functional elements 3241, 3242 formed on the first and second anode elements 3221, 3222 of the respective one of the anode units 322a of the respective one of the columns of the anode array. The OLED device further includes a bridge array of bridging units 34 disposed in the first stack 32, arranged in columns, and disposed on the same layer as the cathode layer 323. Each of the bridging units 34 includes oppositely disposed first and second bridging lines 341, 342. Each of the first and second bridging lines 341, 342 of each of the bridging units 34 of each of the columns of the bridge array is connected to the first and second anode elements 3221, 3222 of a respective one of the anode units 322a of a respective one of the columns of the anode array through a lower via array.

The lower via array includes a plurality of lower via units 35b arranged in columns. Each of the lower via units 35b of each of the columns of the lower via array includes two first lower contact vias 352 extending from the first bridging line 341 of a respective one of the bridging units 34 of a respective one of the columns of the bridging array to the first and second anode elements 3221, 3222 of a respective one of the anode units 322a of a respective one of the columns of the anode array, and two second lower contact vias 353 extending from the second bridging line 342 of a respective one of the bridging units 34 of a respective one of the columns of the bridging array to the first and second anode elements 3221, 3222 of the respective one of the anode units 322a of the respective one of the columns of the anode array.

The OLED device further includes an IC circuit 37 mounted on an edge of the second surface 3312 of the first insulative layer 331 for controlling the injection of current into the anode units 322a of the anode layer 322. The conductive column lines 332 are electrically connected to the IC circuit 37 through first traces 371 formed on the second surface 3312 of the first insulative layer 331 and vias 381 extending through the first and second surfaces 3311, 3312 of the first insulative layer 331. The conductive row lines 333 are electrically connected to the IC circuit 37 through second traces 372 formed on the second surface 3312 of the first insulative layer 331.

Figure 17:
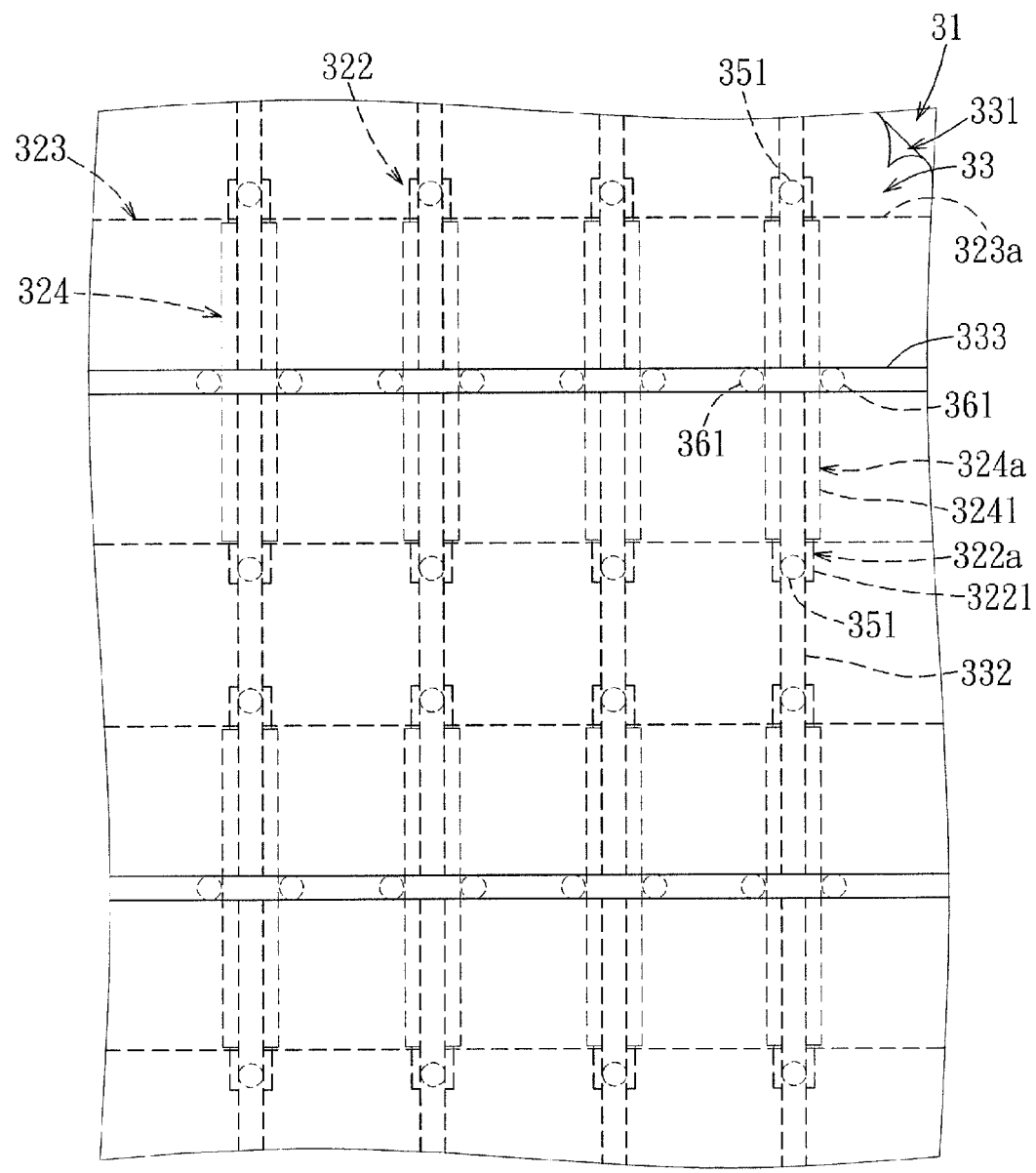
FIG. 17 is a fragmentary schematic plan view of the second preferred embodiment of the OLED device according to the present invention.
Figure 18:
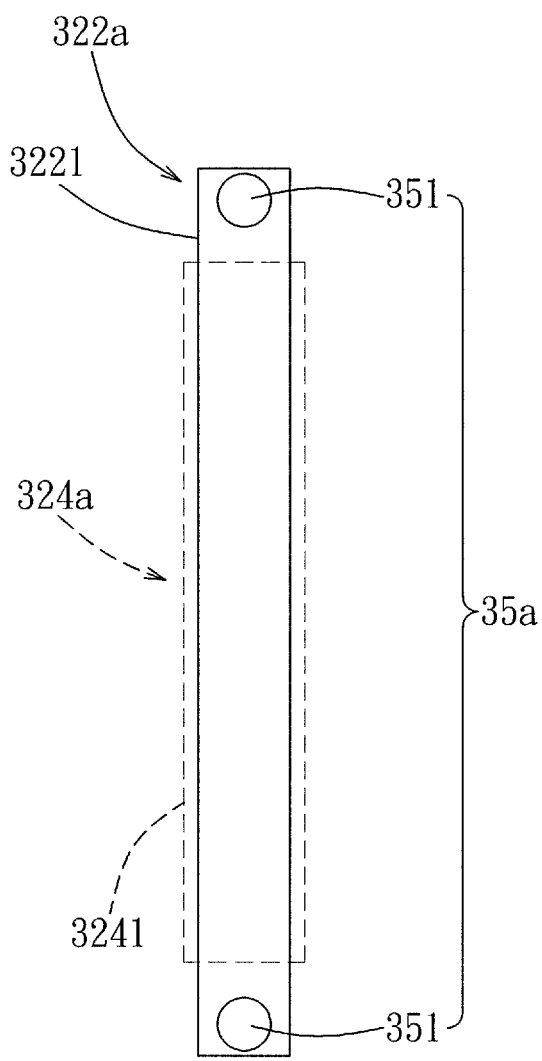
FIG. 18 is a schematic view illustrating an assembly of an anode unit, a functional unit, a bridging unit and a lower via unit of the second preferred embodiment of the OLED device.

FIGS. 17 and 18 illustrate the second preferred embodiment of the OLED device according to this invention. The second preferred embodiment of the OLED device differs from the previous embodiment in that each of the anode units 322a of the anode array includes one anode element 3221, that each of the functional units 324a includes one functional element 3241 formed on the anode element 3221 of the respective one of the anode units, and that the bridging array is no longer needed. Each of the upper via units 35a of each of the columns of the upper via array includes two upper contact vias 351 extending from the respective one of the conductive column lines 332 to two opposite ends of the anode element 3221 of a respective one of the anode units 322a of a respective one of the columns of the anode array.

The drawbacks of the aforesaid conventional display tile 2, especially for a flexible display tile, include substantially low manufacturing yield and hence poor display quality due to significant layer-to-layer misalignment errors and unstable and long current injection path of the transparent material, such as ITO that forms the aforesaid column electrodes 223. Since ITO may easily break during the patterning and lamination processes, the pixel design of the aforesaid conventional display tile 2 cannot resolve the potential display manufacturing drawbacks resulting from the use of the flexible substrate. Since the aforesaid conventional display tile 2 only has one current injecting point located at one end of each column electrode 223 at which the current from the electronic circuitry 2113 is injected into each column electrode 223, the injected current can only reach a small distance of the entire length of the column electrode 223 due to the high sheet resistance of the transparent conductive material of the column electrode 223. Moreover, as an example, when the column electrode 223 is broken into two halves at a middle position (which is likely to happen during manufacturing process of the display tile 2), the injected current can only flow into one of the halves of the column electrode 223.

With the provision of the first and second bridging lines 341, 342, or the column line 332, and the upper via units in the electroluminescent assembly 3 of the OLED device of this invention, the number of the current injection paths into the first and second anode elements 3221, 3222 on a flexible substrate can be increased, extremely high precision requirement in layer-to-layer alignment is no longer necessary, and the current can still be injected into the entire length of the first and second anode elements 3221, 3222 even when there is a break in the first and second anode elements 3221, 3222 during the manufacturing process. Hence, with the inclusion of the first bridging line 341 and/or the second bridging line 342, the column line 332 and the upper via units in the electroluminescent assembly 3 of the OLED device of this invention, the aforementioned drawback of unsuccessful injection of current to at least some of the functional elements can be overcome.

Figure 19:
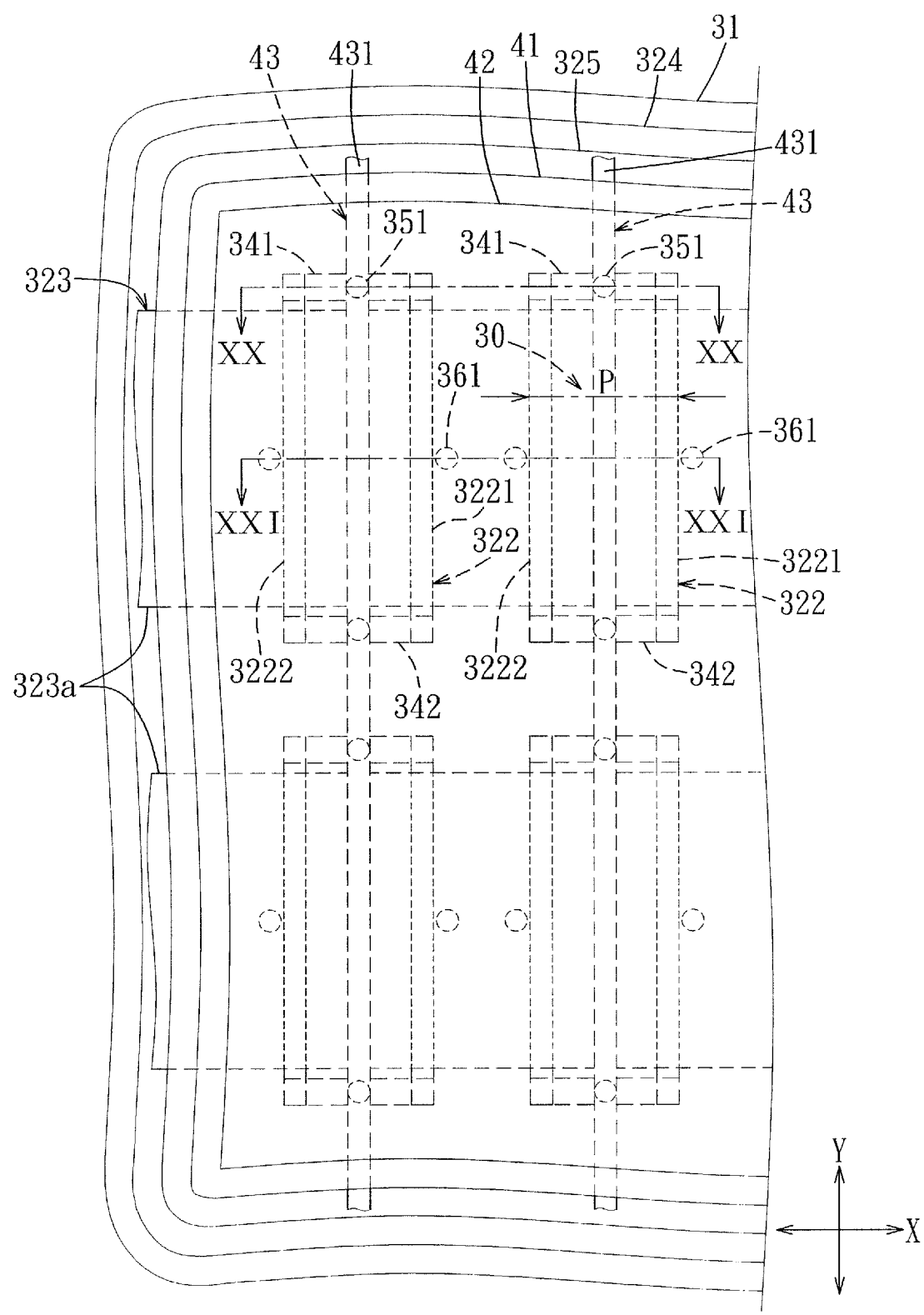
FIG. 19 is a fragmentary schematic view of the third preferred embodiment of the OLED device according to the present invention.
Figure 20:
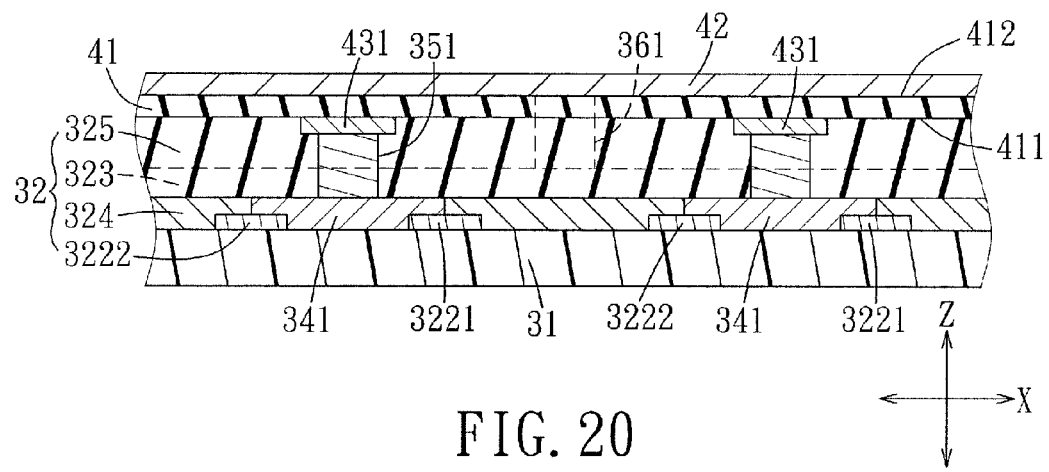
FIG. 20 is a fragmentary sectional view taken along line XX-XX of FIG. 19.
Figure 21:
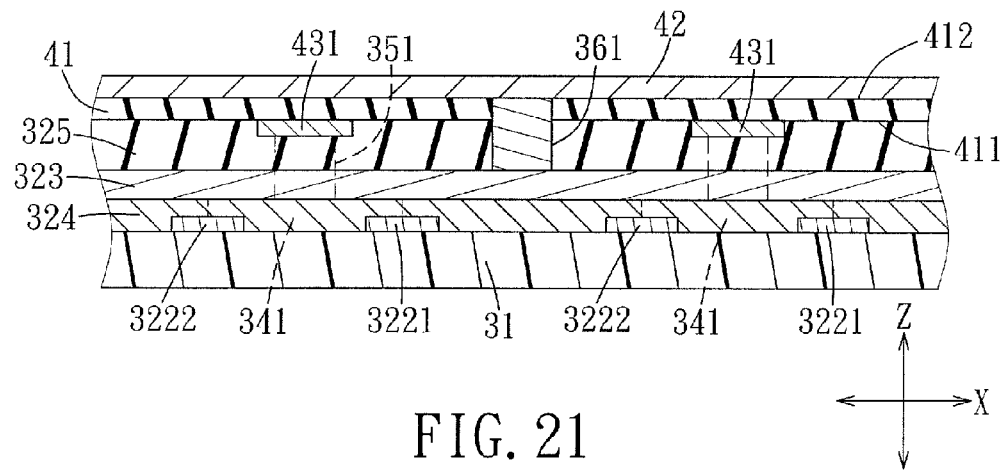
FIG. 21 is a fragmentary sectional view taken along line XXI-XXI of FIG. 19.

FIGS. 19 to 21 illustrate the third preferred embodiment of the OLED device according to the present invention.

The OLED device of the third preferred embodiment includes: a transparent substrate 31; a light-emitting stack 32 stacked on the transparent substrate 31 and including a patterned transparent anode layer 322, a cathode layer 323, and a functional layer 324 disposed between the anode layer 322 and the cathode layer 323, the anode layer 322 including an anode array of spaced apart anode units arranged in columns and rows, each of the anode units having first and second anode elements 3221, 3222 that extend in a column direction (Y) and that are aligned with and spaced apart from each other by a gap 30 along a row direction (X) transverse to the column direction (Y), the gap 30 having a width (P) along the row direction (X), wherein the anode layer 322, the functional layer 324, and the cathode layer 323 are stacked one above another along a vertical direction (Z) transverse to the row direction (X) and the column direction (Y); an anode-connecting metallic layer 43 stacked on the light-emitting stack 32 along the vertical direction (Z); a cathode-connecting metallic layer 42 stacked on the light-emitting stack 32 along the vertical direction (Z) and connected electrically to the cathode layer 323; and a plurality of conductive bridging lines 341, 342 disposed in the light-emitting stack 32 and connected electrically to the anode-connecting metallic layer 43. Each of the bridging lines 341, 342 extends in the row direction (X) and crosses the gap 30 between the first and second anode elements 3221, 3222 of a respective one of the anode units, such that the first and second anode elements 3221, 3222 of each of the anode units are electrically connected to each other through a respective pair of the bridging lines 341, 342. Alternatively, the first and second anode elements 3221, 3222 of each of the anode units may extend in a first length direction (not shown) that is different from and that is inclined to the column direction (Y) and the row direction (X) and that is transverse to the vertical direction (Z), and each of the bridging lines 341, 342 may extend in a second length direction (not shown) that is different from the first length direction and that is transverse to the vertical direction (Z). The width (P) of the gap 30 may range from 10 μm to several centimeters depending on the actual requirements in electroluminescent resolution.

In this embodiment, the OLED device further includes an overcoat 325, an insulative sheet 41, a plurality of anode-connecting vias 351, and a plurality of conductive cathode-connecting vias 361. The overcoat 325 covers the cathode layer 323 and the bridging lines 341, 342. The insulative sheet 41 is bonded to and stacked on the overcoat 325 along the vertical direction (Z), and has first and second surfaces 411, 412. The conductive cathode-connecting vias 361 extend through the overcoat 325 and the first and second surfaces 411, 412 of the insulative sheet 41. The cathode-connecting metallic layer 42 is formed on the second surface 412 of the insulative sheet 41, and is electrically connected to the cathode layer 323 through the cathode-connecting vias 361. The anode layer 322 and the bridging lines 341, 342 are formed on the transparent substrate 31. The anode-connecting vias 351 extend through the overcoat 325. The anode-connecting metallic layer 43 includes a plurality of conductive column lines 431 that extend in the column direction (Y), that are formed on the first surface 411 of the insulative sheet 41, and that are electrically connected to the bridging lines 341, 342 through the anode-connecting vias 351.

The cathode layer 323 has a layer thickness ranging from 50 nm to 200 nm, and is made from aluminum. The cathode-connecting metallic layer 42 has a layer thickness greater than 1 μm, and is made from a metal selected from the group consisting of silver, copper, and the combination thereof. The anode layer 322 is made from indium tin oxide. The bridging lines 341, 342 are made from a metal selected from the group consisting of silver, copper, aluminum, and combinations thereof.

Figure 22:
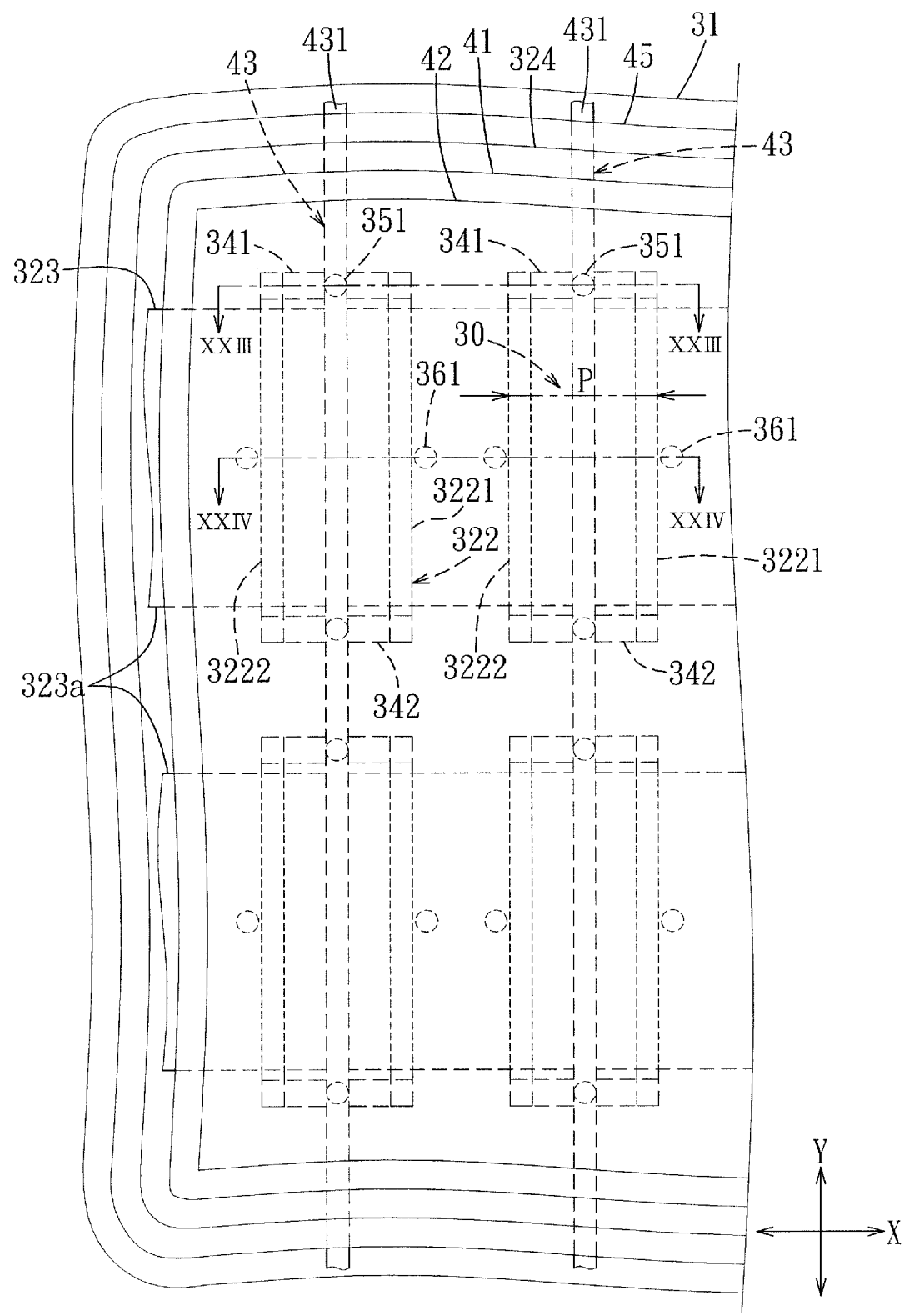
FIG. 22 is a fragmentary schematic view of the fourth preferred embodiment of the OLED device according to the present invention.
Figure 23:
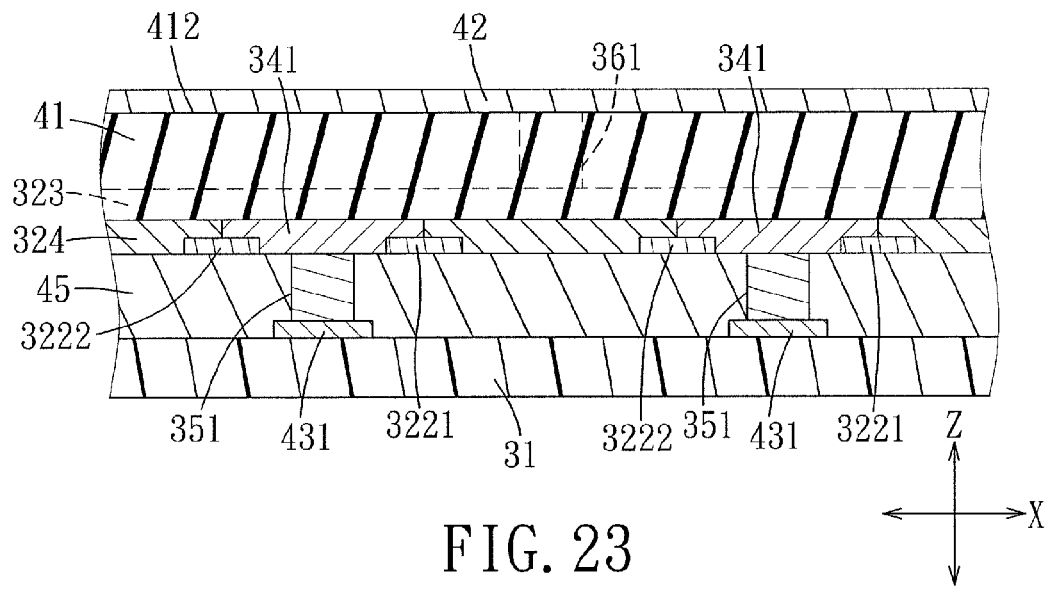
FIG. 23 is a fragmentary sectional view taken along line XXIII-XXIII of FIG. 22.
Figure 24:
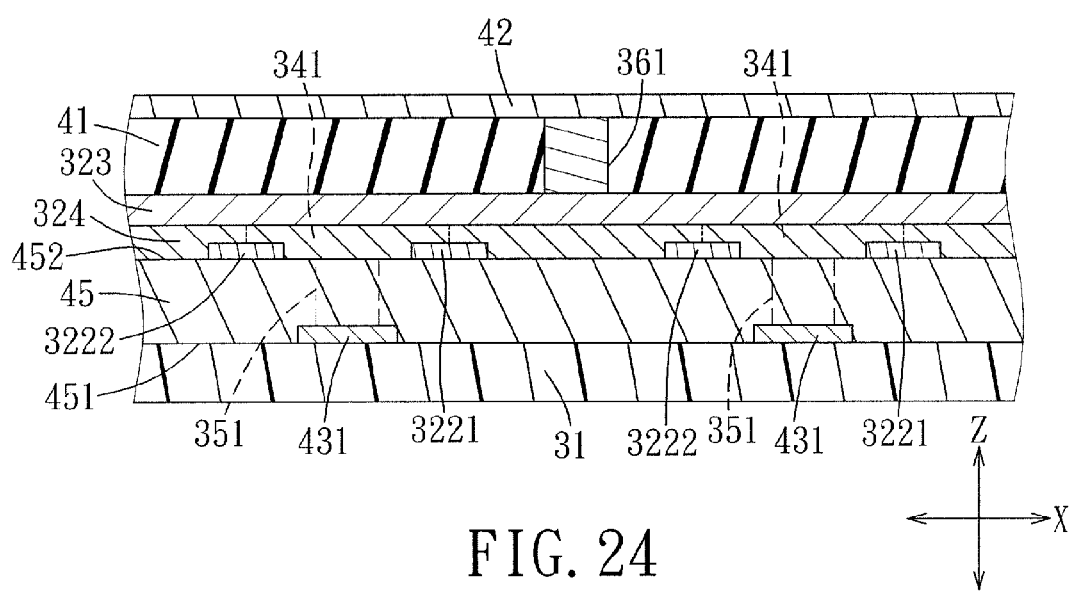
FIG. 24 is a fragmentary sectional view taken along line XXIV-XXIV of FIG. 22.

FIGS. 22 to 24 illustrate the fourth preferred embodiment of the OLED device according to the present invention. The fourth preferred embodiment differs from the third preferred embodiment in the connection between the bridging lines 341, 342 and the anode-connecting metallic layer 43 and between the cathode layer 323 and the cathode-connecting metallic layer 42.

In this embodiment, the OLED device further includes a first insulative sheet 41, a plurality of cathode-connecting vias 361, a second insulative sheet 45, and a plurality of anode-connecting vias 351. The first insulative sheet 41 is bonded to and stacked on the cathode layer 323 along the vertical direction (Z), and has a surface 412. The cathode-connecting vias 361 extend from the cathode layer 323 through the first insulative sheet 41. The cathode-connecting metallic layer 42 is formed on the surface 412 of the first insulative sheet 41, and is electrically connected to the cathode layer 323 through the cathode-connecting vias 361. The second insulative sheet 45 is bonded to and stacked on the transparent substrate 31 along the vertical direction (Z), and has first and second surfaces 451, 452. The anode layer 322 and the bridging lines 341, 342 are formed on the second surface 452 of the second insulative sheet 45. The anode-connecting vias 351 extend through the first and second surfaces 451, 452 of the second insulative sheet 45. The anode-connecting metallic layer 43 includes a plurality of column lines 431 that are formed on the first surface 451 of the second insulative sheet 45 and that are electrically connected to the bridging lines 341, 342 through the anode-connecting vias 351.

With the inclusion of the bridging lines 341, 342 to bridge the anode elements 3222, 3221 of the anode layer 322, and the anode-connecting vias 351 to interconnect the anode-connecting metallic layer 43 and the bridging lines 341, 342, the aforesaid drawbacks associated with the prior art can be alleviated.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. An organic light-emitting diode (OLED) device comprising:
   a transparent substrate;
   a light-emitting stack stacked on said transparent substrate and including a patterned transparent anode layer, a cathode layer, and a functional layer disposed between said anode layer and said cathode layer, said anode layer including an anode array of spaced apart anode units arranged in columns and rows, each of said anode units having first and second anode elements that extend in a column direction and that are aligned with and spaced apart from each other along a row direction transverse to the column direction, wherein said anode layer, said functional layer, and said cathode layer are stacked one above another along a vertical direction transverse to the row direction and the column direction;
   an anode-connecting metallic layer stacked on said light-emitting stack along the vertical direction;
   a cathode-connecting metallic layer stacked on said light-emitting stack along the vertical direction and connected electrically to said cathode layer; and
   a plurality of conductive bridging lines disposed in said light-emitting stack and connected electrically to said anode-connecting metallic layer, each of said bridging lines extending in the row direction such that said first and second anode elements of each of said anode units are electrically connected to each other through a respective one of said bridging lines.

2. The OLED device of claim 1, further comprising an overcoat, an insulative sheet and a plurality of conductive cathode-connecting vias, said overcoat covering said cathode layer and said bridging lines, said insulative sheet being bonded to and stacked on said overcoat along the vertical direction and having first and second surfaces, said conductive cathode-connecting vias extending through said overcoat and said first and second surfaces of said insulative sheet, said cathode-connecting metallic layer being formed on said second surface of said insulative sheet and being electrically connected to said cathode layer through said cathode-connecting vias.

3. The OLED device of claim 2, further comprising a plurality of anode-connecting vias, said anode layer and said bridging lines being formed on said transparent substrate, said anode-connecting vias extending through said overcoat, said anode-connecting metallic layer including a plurality of conductive column lines that are formed on said first surface of said insulative sheet and that are electrically connected to said bridging lines through said anode-connecting vias.

4. The OLED device of claim 1, further comprising an insulative sheet and a plurality of cathode-connecting vias, said insulative sheet being bonded to and stacked on said cathode layer along the vertical direction and having a surface, said cathode-connecting vias extending from said cathode layer through said insulative sheet, said cathode-connecting metallic layer being formed on said surface of said insulative sheet and being electrically connected to said cathode layer through said cathode-connecting vias.

5. The OLED device of claim 4, further comprising a second insulative sheet and a plurality of anode-connecting vias, said second insulative sheet being bonded to and stacked on said transparent substrate along the vertical direction and having first and second surfaces, said anode layer and said bridging lines being formed on said second surface of said second insulative sheet, said anode-connecting vias extending through said first and second surfaces of said second insulative sheet, said anode-connecting metallic layer including a plurality of column lines that are formed on said first surface of said second insulative sheet and that are electrically connected to said bridging lines through said anode-connecting vias.

6. The OLED device of claim 1, wherein said cathode layer has a layer thickness ranging from 50 nm to 200 nm, and is made from aluminum, said cathode-connecting metallic layer having a layer thickness greater than 1 μm and being made from a metal selected from the group consisting of silver, copper, and the combination thereof, said anode layer being made from indium tin oxide, said bridging lines being made from a metal selected from the group consisting of silver, copper, aluminum, and the combinations thereof.

7. An organic light-emitting diode (OLED) device comprising:
   a transparent substrate;
   a light-emitting stack stacked on said transparent substrate and including a patterned transparent anode layer, a cathode layer, and a functional layer disposed between said anode layer and said cathode layer, said anode layer including an anode array of spaced apart anode units arranged in columns and rows, each of said anode units having first and second anode elements that are aligned with and spaced apart from each other by a gap along a row direction and that extend in a first length direction different from the row direction, said anode layer, said functional layer, and said cathode layer being stacked one above another along a vertical direction transverse to the row direction and the first length direction of said first and second anode elements;
   an anode-connecting metallic layer stacked on said light-emitting stack along the vertical direction;
   a cathode-connecting metallic layer stacked on said light-emitting stack along the vertical direction and connected electrically to said cathode layer; and a plurality of conductive bridging lines disposed in said light-emitting stack and connected electrically to said anode-connecting metallic layer, each of said bridging lines crossing said gap between said first and second anode elements of a respective one of said anode units and extending in a second length direction different from the first length direction, such that said first and second anode elements of each of said anode units are electrically connected to each other through the respective one of said bridging lines.

8. The OLED device of claim 7, wherein said bridging lines extend in the row direction.

9. The OLED device of claim 7, further comprising an overcoat, an insulative sheet and a plurality of conductive cathode-connecting vias, said overcoat covering said cathode layer and said bridging lines, said insulative sheet being bonded to and stacked on said overcoat along the vertical direction and having first and second surfaces, said conductive cathode-connecting vias extending through said overcoat and said first and second surfaces of said insulative sheet, said cathode-connecting metallic layer being formed on said second surface of said insulative sheet and being electrically connected to said cathode layer through said cathode-connecting vias.

10. The OLED device of claim 9, further comprising a plurality of anode-connecting vias, said anode layer and said bridging lines being formed on said transparent substrate, said anode-connecting vias extending through said overcoat, said anode-connecting metallic layer including a plurality of conductive column lines that are formed on said first surface of said insulative sheet and that are electrically connected to said bridging lines through said anode-connecting vias.

11. The OLED device of claim 7, further comprising an insulative sheet and a plurality of cathode-connecting vias, said insulative sheet being bonded to and stacked on said cathode layer along the vertical direction and having a surface, said cathode-connecting vias extending from said cathode layer through said insulative sheet, said cathode-connecting metallic layer being formed on said surface of said insulative sheet and being electrically connected to said cathode layer through said cathode-connecting vias.

12. The OLED device of claim 11, further comprising a second insulative sheet and a plurality of anode-connecting vias, said second insulative sheet being bonded to and stacked on said transparent substrate along the vertical direction and having first and second surfaces, said anode layer and said bridging lines being formed on said second surface of said second insulative sheet, said anode-connecting vias extending through said first and second surfaces of said second insulative sheet, said anode-connecting metallic layer including a plurality of column lines that are formed on said first surface of said second insulative sheet and that are electrically connected to said bridging lines through said anode-connecting vias.

13. The OLED device of claim 7, wherein said cathode layer has a layer thickness ranging from 50 nm to 200 nm, and is made from aluminum, said cathode-connecting metallic layer having a layer thickness greater than 1 μm and being made from a metal selected from the group consisting of silver, copper, and the combination thereof, said anode layer being made from indium tin oxide, said bridging lines being made from a metal selected from the group consisting of silver, copper, aluminum, and the combinations thereof.

* * * * *